United States Patent
Dunnam

(10) Patent No.: US 9,692,391 B2
(45) Date of Patent: Jun. 27, 2017

(54) ADJUSTABLE COMPENSATION RATIO FEEDBACK SYSTEM

(71) Applicant: Linear Research Associates, Inc., Trumansburg, PA (US)

(72) Inventor: Curt R. Dunnam, Trumansburg, NY (US)

(73) Assignee: Linear Research Associates, Inc., Trumansburg, NY (US)

( * ) Notice: Subject to any disclaimer, the term of this patent is extended or adjusted under 35 U.S.C. 154(b) by 983 days.

(21) Appl. No.: 13/959,787

(22) Filed: Aug. 6, 2013

(65) Prior Publication Data

US 2015/0042392 A1    Feb. 12, 2015

(51) Int. Cl.
| | |
|---|---|
| *G01R 35/00* | (2006.01) |
| *H03H 11/04* | (2006.01) |
| *G01R 33/025* | (2006.01) |
| *G01R 33/00* | (2006.01) |
| G01R 33/389 | (2006.01) |
| G05B 13/04 | (2006.01) |

(52) U.S. Cl.
CPC ..... *H03H 11/0405* (2013.01); *G01R 33/0041* (2013.01); *G01R 33/0076* (2013.01); *G01R 33/025* (2013.01); *G01R 33/389* (2013.01); *G05B 13/042* (2013.01)

(58) Field of Classification Search
USPC .......................................... 327/311; 702/106
See application file for complete search history.

(56) References Cited

U.S. PATENT DOCUMENTS

| | | |
|---|---|---|
| 5,073,744 A | 12/1991 | Buhler |
| 5,465,012 A | 11/1995 | Dunnam |
| 5,469,058 A * | 11/1995 | Dunnam .............. G01R 33/028 324/258 |
| 7,436,120 B2 | 10/2008 | Buschbeck et al. |
| 2007/0156262 A1* | 7/2007 | Craven ................ G05B 13/042 700/73 |
| 2008/0103391 A1* | 5/2008 | Dos Santos Varela ................... G01T 1/1615 600/436 |
| 2013/0057191 A1* | 3/2013 | Yoshiura ................ G05B 19/19 318/600 |

FOREIGN PATENT DOCUMENTS

| | | |
|---|---|---|
| GB | 1285694 | 9/1968 |
| GB | 2154031 | 8/1985 |

* cited by examiner

*Primary Examiner* — Paul D Lee
(74) *Attorney, Agent, or Firm* — Mark Levy; Hinman, Howard & Kattell, LLP

(57) ABSTRACT

Apparatus for implementing Adjustable Compensation Ratio (ACR) active shielding or control of physical fields (magnetic, electric, electromagnetic, acoustic, etc.), comprising the addition of a secondary internal feedback loop within a conventional primary closed feedback loop topology. Compensation-ratio transfer function order and coefficients adjustment permits accommodating frequency-dependent and frequency-independent effects within a Protected Volume when a system field sensor or sensor array is not at the exact location where external field interference must be optimally canceled. A Laplace polynomial term precisely sets this parameter in a supplementary feedback link by modeling the frequency-dependent characteristic of an Interacting Medium without deleterious effect on other desirable primary closed-loop characteristics. The inventive ACR can be used in advanced active cancellation for magnetic shielding purposes.

31 Claims, 3 Drawing Sheets

ADJUSTABLE COMPENSATION RATIO FEEDBACK SYSTEM

FIELD OF THE INVENTION

The present invention relates to Adjustable Compensation Ratio (ACR) negative-feedback loop topologies and, more particularly, to an ACR apparatus for adjusting or compensating magnetostatic, electrostatic, electromagnetic, acoustical or other types of physically influential fields.

BACKGROUND OF THE INVENTION

In certain scientific, engineering and medical fields, it is important to provide closed-loop parametric adjustment, control, or compensation of a physical field within an Operational Volume (OV). The adjusted, controlled or compensated field may exist within a sub-space of the OV defined herein as the Protected Volume (PV), where the PV is partially shielded from the adjusting, controlling or compensating field generating element(s) and also from the field parametric feedback sensor by an intervening, Interacting Medium (IM). An IM is an interval or region of material, of any phase or combination of phases, i.e., solid, liquid, gas or plasma, that physically interacts with site interfering and compensating, or alternatively, controlled fields.

It is most advantageous to compensate for any arbitrary anisotropic, proximity-dependent or frequency-domain effect of the IM, which results in a capability to improve accuracy in the spatial and temporal response of the control or compensation field within the PV.

To illustrate, counteracting site-specific interfering magnetic fields induced within the isocenter (i.e., interior or PV), of the magnet associated with a magnetic resonance imaging (MRI) instrument would be most helpful in operating such MRI devices at the highest possible resolution in such locations. Historically, certain techniques have been employed in problematic MRI installations to achieve isocenter field control utilizing intentionally superimposed extraneous magnetic fields for compensation (subtractive nulling) of extraneous interfering magnetic fields. At MRI sites, the relative coupling behavior of the interfering and the compensating magnetic fields into the MRI magnet isocenter can differ substantially from the relative coupling behavior of the interfering and the compensating magnetic fields into a field sensor (probe) located outside of the magnet windings, or windings and yoke. This effect is mainly due to the differing interactions of the MRI magnet with respect to the compensation coil and geometry of the extraneous interfering source(s).

In general, the MRI's magnet structure consisting of windings (in the case of a superconducting magnet) or windings and yoke (for a resistive, or nonsuperconducting magnet) may be considered an IM that tends to differentially intercept and therefore introduce a differential sensitivity to the compensating field from the Active Compensation Shielding (ACS) driven coils that are in close proximity compared with the interfering field from external sources located at significantly greater distances. With respect to the unity ratio of these fields at the probe, as established by a conventional negative-feedback ACS topology, the MRI isocenter will appear to be either under- or over-compensated. In the former case the residual field component is in-phase and proportional to the interfering field; in the latter, more common case the apparent polarity of the interfering magnetic field component is inverted by the action of the active compensation system. In either case, the finite limitation on interfering field reduction within the isocenter, i.e., PV, constitutes a fundamental and serious restriction on the effectiveness of the ACS when the probe is located at a distance from the isocenter.

High static fields within and surrounding most MRI instruments preclude locating the feedback sensor within or immediately adjacent to the PV. Consequently, the ability to accurately control or cancel extraneous fields within such magnets has previously been limited to standard closed-loop negative feedback approaches that provide only marginally accurate approximation within the critical MRI isocenter region even though the field cancellation behavior at the actual sensor location may be nearly ideal.

When the sensor must be located outside of the PV, a secondary spatial consideration is compensation of possible differential error due to an interfering field gradient along the baseline between the sensor, located outside of the PV, and the isocenter within the PV. Differential error occurs because the compensation field is nominally constant throughout the volume for optimum system performance, therefore the residual field, which is equal to the difference between the interfering field from a given source and the compensating field, increases with distance from the field sensor when a field gradient along the baseline is present. In this situation, also, the canonic ACS approach cannot achieve ideal interfering field compensation.

In addition to the spatial considerations described above, significant temporal degradation of control or compensation accuracy for a canonic ACS feedback system can occur in applications where a physically Interacting Medium exists between the OV, where the sensor is located, and the PV where ideal field control or compensation is desired. For an MRI instrument, the physically Interacting Medium responsible for temporal alteration is represented by, depending on the installation, either the ferromagnetic yolk and conductive coils of a resistive electromagnet or the conductive coils of a superconducting magnet. Because the magnetic field sensor must be located outside of the IM-shielded MRI magnet isocenter, a conventional overall control or compensating system as described in the prior art has no "awareness" of the IM effect on traversing fields and, consequently, cannot compensate for frequency-dependent or direction-dependent interactive effects of the MRI's IM region.

The deleterious effects of an MRI's IM on the control or compensating system accuracy are thus twofold. Principally, the IM modifies the magnetic field traversing it in amplitude and phase, with the modification coefficients varying as a function of source direction and frequency. In a significant fraction of installations subject to problematic magnetic field interference, the MRI IM exhibits sufficient time-dependent field interaction that frequency-specific correction is required in order to achieve adequate compensation of the interfering field within the magnet isocenter or, alternatively, programmable control of a supplemental field within the isocenter. To achieve satisfactory parametric control of the residual field within the PV, it is therefore necessary to incorporate compensation for such temporal IM effects into the MRI active-compensation feedback signal processing system.

It would therefore be desirable to create a control or compensating system for such MRI applications, or other similar applications involving physical fields to be controlled or compensated, where exacting control or compensation of such fields may be provided within the PV, even with an appreciable distance between a sensor located in the OV and external to the PV.

A fundamental principle of a requisite ACR implementation is that spatial and temporal ratiometric offset control or compensation can be implemented by means of a rigorously predictable set of parametric coefficients that theoretically match and cancel any gradient or dynamic IM effects on the superimposed fields within the PV.

For a field-compensation situation where an IM exists that physically modifies the fields operating within a system PV, it is also probable that the IM will affect the interfering and compensating fields differently. Interaction disparity of this type can be due, for example, to relative proximity of the interfering source and compensating means, or to IM anisotropy with respect to the interfering source and compensating field dominant axes.

A second fundamental principle of the ACR invention is that it permits direct compensation for such interaction differences by employing an expanded set of rigorously predictable parametric coefficients that define the required compensation. These coefficients may be determined by analysis of measured data or by empirical tuning in situ. Once set, the coefficients do not usually require readjustment, as they are dependent only on invariant characteristics of the IM itself.

In the example embodiment, one may consider the MRI magnet assembly to be the IM. The magnet may be permanent, resistive or superconducting. Each type of magnet affects the residual fields from the interfering and compensating magnetic field sources in a slightly different way. For permanent and resistive magnets, the magnet yoke permeability and geometric flux path vary anisotropically with source direction, leading to intensity differences in the isocenter and errors in field cancellation. In resistive magnets, shunted windings can also contribute frequency-dependent magnitude and phase variations that magnify the cancellation error. Superconducting magnets, while largely self-shielding per Lenz's Law, in practice allow some ingress of leakage flux into the magnet isocenter. The resulting interfering field usually exhibits time-delayed field variations due to induced redistribution of persistent currents in the magnet windings.

For any of these magnet types, residual flux demonstrating pronounced frequency-dependent magnitude and phase modification can be found in the magnet isocenter at an operationally significant level when sufficiently strong external magnetic fields are present. When an external compensating field is applied by a closed-loop feedback system utilizing a field sensor external to the isocenter, the residual magnetic field within the isocenter is thus described by the frequency- and direction-dependent difference between the modified interfering field and the modified compensation, or cancelling, field. Therefore, when addressing problematic MRI site magnetic interference, frequency-dependent differential compensation uniquely provided by the ACR invention is necessary to achieve a high level of interfering signal cancellation.

Application of the Adjustable Compensation Ratio feature of the instant invention is realized by a secondary feedback means wherein parametric information that describes the magnet's self-shielding transfer characteristic is incorporated into the overall ACR feedback loop. This information enables arbitrarily exact cancellation of the fields within the magnet solely as a function of the inner feedback loop parametric accuracy. These parameters are usually determined empirically on site but, alternatively, can be derived analytically from suitable measurements describing a specific magnet's field translation characteristic. Importantly, once the frequency- and direction-dependent parameters have been set within the secondary feedback loop, the system parametric sensitivity to environmental changes external to the magnet is low due to the large open-loop gain of the overall ACR system feedback loop. Consequently, even though the magnetic field sensor is located outside the magnet proper, a high initial attenuation factor within the isocenter PV can be maintained, without the need for periodic system "tuning" adjustments, regardless of moderate changes in the MRI system ferromagnetic environment.

Additional embodiments for other types of influential fields include shielding or controlling electrostatic fields, such as within an isolating dielectric medium, shielding or controlling electromagnetic energy irradiating an OV, such as within a partially conductive plasma sheath and shielding or controlling acoustical energy within an OV that may be surrounded by a medium physically interacting with such energy.

In other embodiments, Active Cancellation Systems (ACS) can be provided similar to the magnetic field case, or for control or adjustment of the parameters as needed to minimize or adjust either the absolute magnitude of, or variation of fields within volumes semi-shielded from the controlling influence.

Developed for improved interfering field attenuation with respect to previous magnetic active-shielding technology, the instant invention finds immediate utility in that area. There, as described above, it adds the capability to deeply null residual magnetic field interference over an arbitrary volume that is separate, and shielded to some degree from the active shielding system's magnetic sensor and compensating field induction coils. This specific application notwithstanding, the invention described by this disclosure is applicable to any closed-loop negative-feedback system intended to mitigate and/or control the influence of external field sources within a Protected Volume (PV), when the sensing means is external to the PV.

DISCUSSION OF PRIOR ART

Great Britain Patent No. 1 285 694 for FLUX STABILIZED MAGNETS issued Sep. 10, 1968 by Higham, discloses a magnet system used in a nuclear magnetic resonance spectrometer, stabilized against short-term flux disturbances by the provision of two symmetric sections, each consisting of a pick-up coil, a main bucking-out winding, and an auxiliary bucking-out winding. The signal generated by the coil is applied to a high-gain amplifier whose output is fed to the windings in such a manner that the auxiliary winding receives a fraction of the energization supplied to the main winding to complement the stabilizing action thereof. This fraction is determined by the setting of a variable resistor that may shunt the winding if a series connection of the two windings replaces a parallel one in the preferred embodiment. The spacing of the two windings is chosen so that the main winding provides a major part of the stabilization and the auxiliary winding supplies the missing compensation percentage required for improved magnetic field cancellation equidistant between the magnet pole pieces. The system requires more than one field sensor, and that the sensing windings be located within the magnet structure.

Great Britain Patent No. 2 154 031 for STRAY-FIELD-CONTROLLED MAGNETIC SELF-PROTECTION issued Aug. 29, 1985 by Geisler, discloses a compensation method for stray fields of a magnetizable object using magnetic fields self-governed by magnetometers and power amplifiers. Magnetic field compensation is obtained by deriving the necessary compensation winding currents from the magnetic-field differences of the arrangement and from the magnetization or the magnetic moment of an object directly within the compensation coil, with the sensors located outside of the compensation coil Operational Volume.

U.S. Pat. No. 5,073,744 for METHOD AND APPARATUS FOR DYNAMIC MAGNETIC FIELD NEUTRALIZATION issued Dec. 17, 1991 by Buhler, discloses a method and apparatus for controlling the magnetic field value within a specified volume, subject to an external ambient magnetic field. The method and apparatus employ a plurality of magnetic field sensors and an associated plurality of coils, together with an electrical drive circuit connecting each of the sensors to the associated coil and including a feedback coupling the output of each of said coils to all of said sensors.

U.S. Pat. No. 5,465,012 for ACTIVE FEEDBACK SYSTEM FOR SUPPRESSION OF ALTERNATING MAGNETIC FIELDS issued Nov. 7, 1995 by Dunnam, discloses a magnetic field compensation system for suppressing alternating or time-varying magnetic fields in a large volume of space. A magnetic sensor detects within a predetermined range of frequencies and generates a signal. A coil or pair of Helmholtz drive coils is positioned into a volume containing the magnetic sensor. A preamplifier is connected to the magnetic sensor for amplifying the signal. A signal processor is connected to the preamplifier for receiving the signal and for providing phase correction and gain. The signal processor has both an averaging and an absolute peak detector for determining magnetic field average and peak excursions. A power amplifier is connected to the coil or pair of Helmholtz drive coils and to the signal processor for receiving and amplifying the processed signal and for applying it to the coil or pair of Helmholtz drive coils. This invention does not include a ratiometric offset loop and secondary summation node.

U.S. Pat. No. 7,436,120 for COMPENSATION OF MAGNETIC FIELDS issued Oct. 14, 2008 by Buschbeck, et al., discloses a number of magnetic field sensors and an arrangement of compensation coils surrounding an operating region. The magnetic field is measured by at least two sensors located at different positions outside the operating region, preferably at opposing positions with respect to a symmetry axis of the operating region, generating respective sensor signals, the sensor signals of the sensors being superposed to a feedback signal, which is converted by a controlling means to a driving signal, used to steer at least one compensation coil. To further enhance the compensation, the driving signal is also used to derive an additional input signal for the superposing step to generate a feedback signal. This additional input signal does not include frequency-dependent compensation, and as such, does not compensate for the properties of an Intervening Medium (IM). A method of cross-coupling compensation is described that is specific only to the disclosed system.

Prior art in the area of closed-loop physical field control or compensation does not teach the novel secondary closed-loop improvement described herein that provides both the ability to compensate for a field gradient across the OV utilizing a single sensor per axis within the OV and, independently, correction for static or frequency-dependent alterations to interfering fields due to an IM existing between the PV and OV. Prior art closed-loop active compensation systems are not capable of producing the arbitrarily high level of compensation that is attainable with the ACR invention when gradient fields and a field-significant IM are present. In the context of the example MRI embodiment, MRI magnets demonstrate significant IM influence with respect to external magnetic fields penetrating into the magnet structure isocenter. A majority of problem MRI sites are also subject to interfering fields that exhibit significant gradients. The prior art cannot adequately address either the gradient or IM conditions or the combined effects of both conditions.

SUMMARY OF THE INVENTION

In accordance with the invention, there is provided an Adjustable Compensation Ratio, closed-loop, negative-feedback system for suppressing magnetic fields, for example, in a large, Operational Volume of space (i.e., an effective operating volume of the compensation means). An axial subsystem is provided having a first magnetic field sensing probe in a Protected Volume of space, pre-amplification and bandshaping filters representable by a Laplace transform complex function, a first summation node, an adjustable post-amplifier, and an output power driver for providing an attenuation coefficient per axis. A parametric sensor, located a predetermined distance from the first magnetic field sensing probe, generates a first ratiometric offset signal. A supplementary direct loop is operatively connected to the first summation node. The supplementary direct loop includes a secondary summation node for receiving the first ratiometric offset signal to correct for alteration of the compensating signal. An intermediary Interacting Medium surrounds the Protected Volume of space. The physical influence due to the Interacting Medium operating on traversing fields is characterized by first and second Laplace transform expressions.

An important feature of the ACR control or compensation negative-feedback loop incorporating the subject invention is the addition of a first ratiometric offset signal processing loop and associated secondary summation node for injecting a ratiometric compensating signal. In all ACR applications, this signal is directly related to the magnitude of the compensating means controlled by the feedback loop, and is further modified by a frequency-dependent transfer function. The effect of adding this subsidiary or adjunct signal is to introduce a predictable, highly stable frequency-dependent ratiometric offset at the feedback loop sensor. When this ratiometric signal path transfer function is operated with correct parametric coefficients, the ACR system can optimally null out field interference at any arbitrary point within the PV, rather than only at the sensor, and can do so in the presence of an intervening IM between the sensor and PV. This ability is indispensable, for example, in magnetic ACR applications, where an extraordinarily high level of shielding performance is required within the MRI magnet assembly but where physical sensor placement within the MRI isocenter (imaging) volume is impractical due to the extremely large magnitude of the static magnetic field. Other potential magnetic active compensation applications of the ACR active-feedback system include, but are not limited to, NMR spectroscopy and superconducting quantum interference device (SQUID) applications.

Implementation of the Adjustable Compensation Ratio invention for magnetic active-compensation shielding is illustrated by a comparison of FIGS. 1 and 2. FIG. 1 illustrates a prior art wideband magnetic field compensation axial sub-system that provides a maximum per-axis attenuation coefficient of approximately 30 dB (factor of 32) within an operational frequency range of 0.001 to 1000 hertz within a reasonable proximity, nominally ±1 m, of its magnetic field sensing probe. The system consists of a magnetic field sensing probe, preamplification and band-shaping filters (Laplace transform S), adjustable postamplification, an output power driver, and a compensating coil or coils, typically arranged in a Helmholtz configuration. In a typical application (e.g., active shielding for electron microscopy), one such subsystem is utilized for each of three orthogonal axes. Attenuation of interfering field strengths is measured by comparing closed-loop vs. open-loop values for the error term $\in$, which is simply the probe's axial output value. The ratio of these error term values is:

$$\frac{\varepsilon|_{T_A=0}}{\varepsilon|_{T_A=G_{MAX}}} \cong \frac{\Psi_{Bi}}{\Psi'_B} = k$$

where:

$T_A$ is the processor/driver amplifier scalar gain function (S may be considered approximately unity and frequency-independent for a practical system);

$G_{MAX}$ is the open loop gain corresponding to highest stable closed-loop attenuation;

$\Psi_{Bi}$ is the uncompensated interfering axial magnetic field value at the sensor location;

$\Psi'_B$ is the compensated interfering axial magnetic field value at the sensor location; and k is the maximum attainable axial magnetic field attenuation coefficient at the sensor location.

Except at the extreme edges of the system response characteristic, a good approximation of the axial subsystem magnetic field attenuation coefficient of any given magnetic ACS installation is given in relation to the magnitude of the open loop gain function, $G_{MAX}$ as $$k = \frac{\Psi_{Bi}}{\Psi'_B} = [Re(S \cdot T_A) + 1]^{-1} \approx \frac{1}{G_{max} + 1}$$

over the operating frequency range.

In limited cases, the canonic closed-loop magnetic ACS approach provides adequate shielding for non-critical applications where the interfering magnetic field gradient is low throughout the intended PV, or where protection within only a relatively small volume about the sensing probe is necessary. However, a much improved technique is required a) when gradients are appreciable and the region of desired maximum field attenuation is offset from the sensor location, or b) when there exists an intermediary IM between the probe and PV such that a differential transfer characteristic exists between the interfering magnetic field and the locally-generated compensating field.

Examples of the former instance include a physical inability to place the field sensor in the PV due to mechanical obstruction (e.g., vacuum chamber, as in electron microscopy) or due to static magnetic field intensity exceeding the dynamic range of the sensor (e.g., MRI isocenter).

Examples of the latter include generally anisotropic, frequency-dependent IM transfer characteristics of MRI static high-field magnets where the frequency-dependent difference between interfering fields and compensating fields often produces a significant residual field within the isocenter. In these situations, it is desirable to introduce, at minimum, an offset parameter, γ (gamma) which permits adjustment for a deep null at any arbitrary point within the full Protected Volume separate from the sensing probe while nonetheless maintaining a high, constant loop attenuation coefficient k over that space. Moreover, in the majority of MRI shielding applications where an operationally significant frequency-dependent differential exists between interfering fields and compensating fields, it is evident that adequate attenuation of the frequency-dependent residual signal requires a frequency-dependent compensating function, which the ACR invention can provide by the inclusion of a term scaled by the offset parameter, γ. It can be demonstrated analytically that this arrangement is, in fact, the optimum solution to the problem of Active Compensation Shielding in instances where the sensing probe is located out of the desired PV and an IM exists between the probe and the PV.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

An Adjustable Compensation Ratio, closed-loop, negative-feedback system is provided for suppressing magnetic fields, for example, in a large, Operational Volume of space. An axial subsystem has a first magnetic field sensing probe in a Protected Volume of space. A parametric sensor, located a predetermined distance from the first magnetic field sensing probe, generates a first ratiometric offset signal. A supplementary direct loop is operatively connected to the first summation node. The supplementary direct loop includes a secondary summation node for receiving the first ratiometric offset signal to correct for alteration of the compensating signal. An intermediary Interacting Medium surrounds the Protected Volume of space. The physical influence due to the Interacting Medium operating on traversing fields is characterized by first and second Laplace transform expressions.

Figure 1:
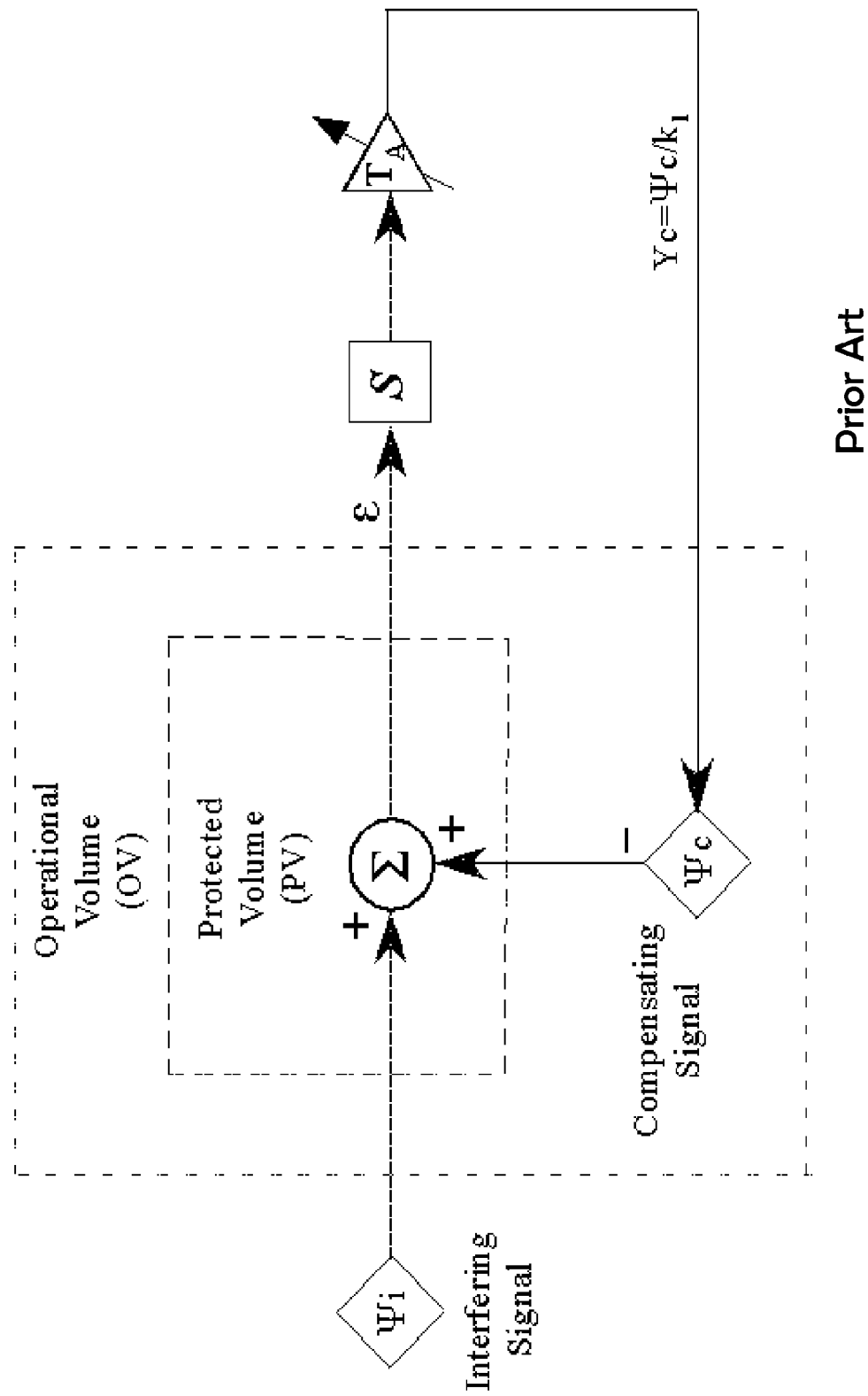
FIG. 1 is a schematic diagram of a generalized unity-ratio active compensation system of the prior art.
Figure 2:
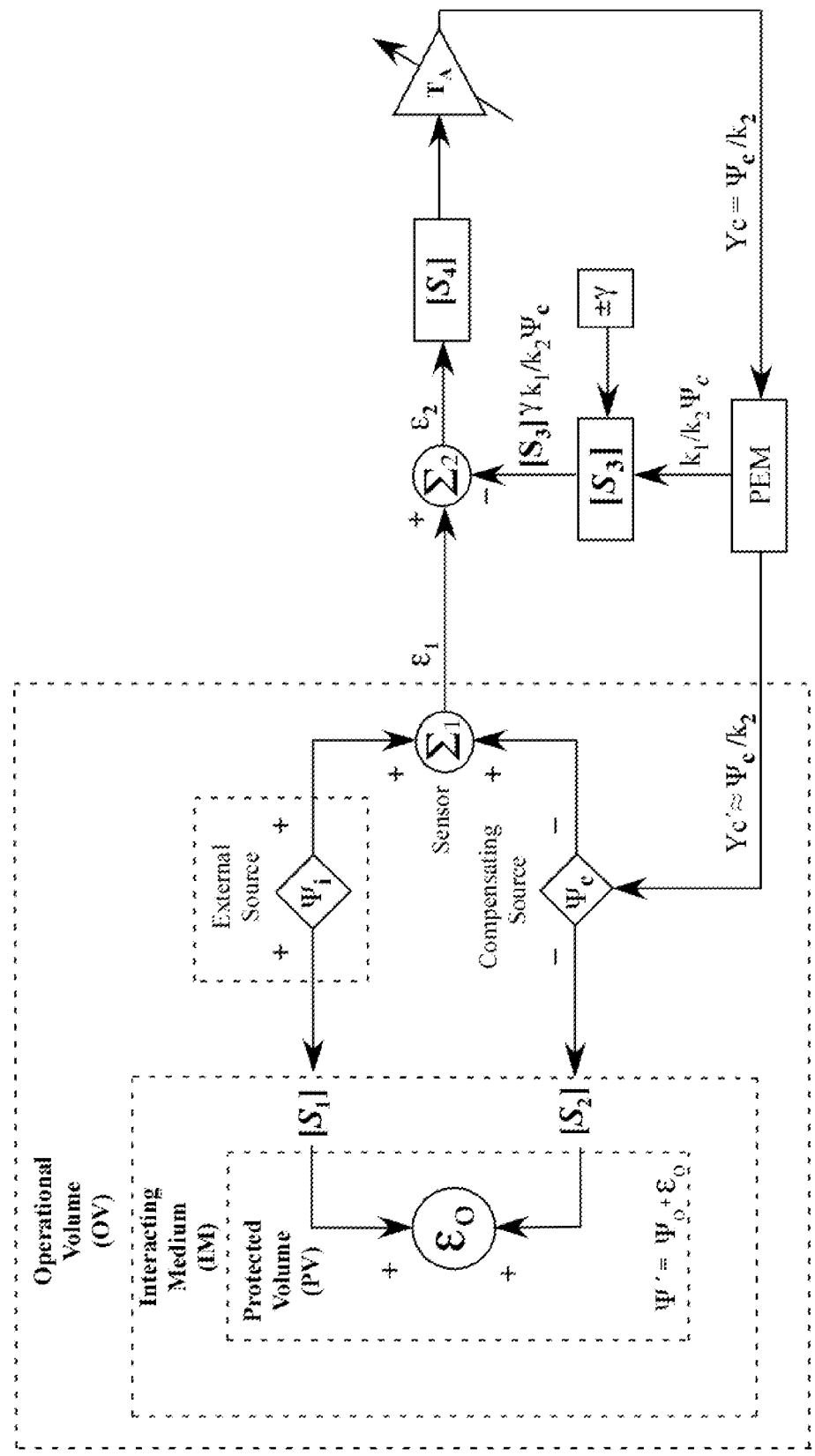
FIG. 2 is a schematic diagram of the Adjustable Compensation Ratio (ACR) generalized system in accordance with the present invention.

A generalized form of the ACR invention implementing these features for active-feedback shielding is described in FIG. 2. This generalized diagram differs from the prior art system depicted in FIG. 1 in that it adds the extraction and frequency-domain processing of a supplementary signal for injection into a secondary summation node, Σ2. Functionally, the injection of a supplementary signal permits the outer closed-loop to correct for alteration of the compensating signal due to either a field gradient or, separately, physical interaction that may occur due to an IM between the location of the sensing means and the PV. Such correction by means of a supplementary loop frequency-dependent additive signal, provides arbitrarily error-free spatial and temporal mapping of the compensating field onto the interfering field under the aforesaid conditions, dependent only on the order of a correction polynomial (in S), the accuracy of its term coefficients, and proper adjustment of the offset scaling parameter, γ.

Accurately minimizing or, alternatively, controlling a residual field (e.g., magnetic, electric, electromagnetic, acoustic) within a PV that is both physically separate and partly isolated from the sensing means requires that the compensating field signal be pre-processed in a manner specific to the invention that results in an accurate replication of the interfering field within the PV. Referring to FIG. 2, it may be noted that subtraction of the compensating field, $\psi_o$, from the interfering field, $\psi$, within the PV is accomplished by inversion of the compensation field, either by the generating means or inversion of the signal prior to the compensating field generating means. The superposition of the two signals is thus a subtraction process yielding a residual field with the magnitude error term, $\in$. In practical active-shielding installations, the average value of $\in$ through the PV is the parameter defining the effective shielding coefficient, which is set by requirements of a specific application. The key feature of the inventive ACR feedback system is that $\in$ may be constrained to any arbitrarily low value to meet the application performance requirements.

Observing that the Protected Volume (PV) may be separated from the Operating Volume (OV) by an Interacting Medium (IM) as illustrated in FIG. 2, and that the physical influence due to a given IM operating on the traversing fields can be fully characterized by Laplace transform expressions $S_1$ and $S_2$, the optimum Laplace signal transform function $S_3$, required within the supplementary loop, can be analytically determined. Moreover, the analytic form demonstrates that in all cases a specific expression for $S_3$ that corresponds to a spatial and temporally-independent null within the PV is realizable. Under such conditions, the resulting average value of $\in$ will then be determined solely by the gradient and time-dependent differential within the PV between the interfering and compensating fields.

Analytic determination of the Laplace transform term $S_3$ is derived from the fundamental equality relating the residual field E within the PV to the IM-modified interfering and compensating signals. By inspection, the residual field is determined as:

$$\in_o = \Psi_i S_1 + (-\Psi_c) S_2 \quad (1)$$

Equivalently, $$\in_o = \Psi_i S_1 - \Psi_c S_2 \quad (2)$$

where:
For $\in_o \Rightarrow 0$,
$\in_o$=error term corresponding to residual interfering signal within the Protected Volume (PV),
$\Psi_i$=frequency-domain representation of interfering signal (magnetostatic, electrostatic, electromagnetic or acoustic),
$S_1$=transfer Laplace transform of Interacting Medium for interfering signal,
$\Psi_c$=frequency-domain representation of compensating signal (field type as per $\Psi_i$, above), and
$S_2$=transfer Laplace transform of Interacting Medium for compensating signal.

$$\Psi_i S_1 - \Psi_c S_2 = 0 \quad (3)$$

Or, $$\Psi_i = \Psi_c \left(\frac{S_2}{S_1}\right), \quad (4)$$

=condition of maximum interference cancellation.

This is the system equation that describes the necessary compensating field condition for minimizing interfering field effects within the PV, or, alternatively, optimizing the accuracy of control effects therewithin. For the ACR system to attain a condition of maximum interference cancellation it is therefore necessary to introduce a compensating term that includes information inherent in the frequency-dependent transfer function $$\left(\frac{S_2}{S_1}\right).$$

In the ACR topology shown in FIG. 2, this term is introduced by means of a supplementary feedback loop consisting of the parameter extraction module (PEM), that is, a parametric extraction means such as a transductor for developing a signal proportional to the parameter being monitored, and the $S_3$ signal processing section. Determination of the requisite supplementary feedback transfer function is treated analytically by first deriving the secondary, or ratiometric, error term $\in_2$ corresponding to the condition of ideal interfering field cancellation at a point within the PV:

$$\in_2 = (\in_1 - \gamma R) \quad (5)$$

where:
$\in_2$=ratiometrically-adjusted error term incorporating compensation for Interacting Medium (IM),
$\in_1$=field compensation error term observed at the sensor output for sensor external to Protected Volume (PV) but within Operational Volume (OV) defined as effective operating volume of compensation means,
R=ratiometric compensation Laplace transform required for condition of $\in_o \Rightarrow 0$,
$\gamma$=ratiometric adjustment parameter employed for site-tuning purposes; its normalized value range is $\pm > 1$, with the effective range of this adjustment determined by the range of ratiometric difference that is inherent in the expression for $S_3$ due to incorporation of the Interacting Medium (IM), and system transfer constants. This adjustment parameter has positive magnitude for $|S_2| > |S_1|$, negative magnitude for $|S_1| > |S_2|$.

Compensation excitation required to achieve the condition of ideal interfering field cancellation or control accuracy can be determined in relation to the input error and the ratiometric terms by inspection and substitution for $\in_2$ to establish the following equality:

$$(\varepsilon_1 - \gamma R) S_4 T_A = Y_c = \frac{\Psi_c}{k_2} \quad (6)$$

where:
$S_4$=signal transfer Laplace transform defined by controller processor (usually tailored to and non-variant for a specific ACR embodiment),
$T_A$=amplifier frequency-independent transfer characteristic (i.e., gain coefficient),
$Y_c$=compensation means excitation value,
$\psi_c$=compensation means induction value,
$k_2$=compensation means transfer/conversion coefficient.
Rearranging to express system main feedback loop parameters in terms of $\gamma R$, the supplemental loop signal processing function:

$$\gamma R = \varepsilon_1 - \frac{\Psi_c}{S_4 T_A k_2} \quad (7)$$

For derivation of the optimum ratiometric compensation factor R, the adjustment parameter, γ, which normally provides an overall scaling factor primarily for convenience in matching an expected range of site conditions but can optionally include scaling of frequency-determining parameters, is set to unity and an equivalence expression incorporating the ratiometric adjustment Laplace transform $S_3$ is introduced:

$$R = \varepsilon_1 - \frac{\Psi_c}{S_4 T_A k_2} = S_3 \Psi_c \frac{k_1}{k_2} \quad (8)$$

where:
$S_3$=idealized transfer Laplace transform defined by the necessary frequency-dependent ratiometric function,
$k_1$=parameter extraction module (PEM) transfer coefficient.

To complete the closed-loop analytic characterization, it is necessary to specify a sensor transfer coefficient:

$$\varepsilon_1 = (\Psi_i - \Psi_c) k_p \quad (9)$$

where:
$k_p$=sensor transfer coefficient (e.g., V/G for magnetic probe).

Substituting and rearranging:

$$\varepsilon_1 = \left(\Psi_c \frac{S_2}{S_1} - \Psi_c\right) k_p = \Psi_c k_p \left(\frac{S_2}{S_1} - 1\right) \quad (10)$$

The above expression may then be substituted into the previous expression for the idealized (i.e., $\varepsilon_{o_{min}} \approx 0$) ratiometric compensation factor R:

$$R = \Psi_c k_p \left(\frac{S_2}{S_1} - 1\right) - \frac{\Psi_c}{S_4 T_A k_2} \quad (11)$$

Or, equivalently:

$$R = \Psi_c k_p \left(\frac{S_2}{S_1} - 1 - \frac{1}{S_4 T_A k_2 k_p}\right) \quad (12)$$

Substituting the equivalent expression (8), above, for R:

$$\Psi_c k_p \left(\frac{S_2}{S_1} - 1 - \frac{1}{S_4 T_A k_2 k_p}\right) = S_3 \Psi_c \frac{k_1}{k_2} \quad (13)$$

which leads directly to a definition of the desired compensation factor, $S_3$, $$S_3 = \left(\frac{S_2}{S_1} - 1 - \frac{1}{S_4 T_A k_2 k_p}\right) \frac{k_p k_2}{k_1} \quad (14)$$

Noting that the term $$\left(\frac{1}{S_4 T_A k_2 k_p}\right) \approx 0$$

when $T_A \gg 1$, and that in practice $T_A$ is typically in the range of 30-40, the equivalent expression for the desired compensation factor, $S_3$ simplifies to:

$$S_3 \cong \left(\frac{S_2}{S_1} - 1\right) \frac{k_p k_2}{k_1} \quad (15)$$

where the primary term, $$\left(\frac{S_2}{S_1} - 1\right),$$

is a Laplace transform expression describing the required compensation with regard to the difference between the transfer functions into the PV; and the secondary term, $$\frac{k_p k_2}{k_1},$$

is a scalar expression describing the magnitude of the required compensation with regard to the scaling coefficients of the sensor probe, the compensation means transfer/conversion coefficient and the parameter extraction module (PEM) transfer coefficient. Equation 15 describes the essence of the invention as employed for arbitrarily accurate compensation or control of physical processes influenced by fields extending through and affected by an Interacting Medium.

Referring still to FIG. 2, the main, or outer loop of the ACR system is a canonic implementation of classical negative feedback loop that consists of the sensor, a signal processing unit applying optional corrective frequency-dependent transfer function $S_4$, and power driver $T_A$. A simple feedback loop of this type is typically employed in the prior art for Active Compensation Shielding, with the operative range of its frequency response appropriate for the field type (e.g., magnetic, electric, electromagnetic, acoustic) being compensated.

In the ACR topology, a supplementary signal voltage representing the affecting feedback quantity, in the present example a compensating magnetic field, is developed by the parameter extraction module (PEM), modified by frequency-dependent transfer function $S_3$ derived in Equation 15 and added as a scalar quantity to the error signal $\varepsilon_1$ that is produced by the first summation node.

The summation node producing error signal $\varepsilon_1$ is in fact the field sensor, or a single channel of the field sensor in the case of a multi-axial system, that generates a signal equivalent to the superposition of the corresponding interfering field and compensating field components at the sensor location.

By the addition of summation node Σ2, it is possible to relocate the point of minimum difference between the interfering field and the compensating field to a position arbitrarily removed from the sensing probe, assuming that an interfering field gradient condition exists, or that an IM exists that exerts a differential effect on the interfering and compensating fields.

As previously discussed, the addition of summation node Σ2 also permits a frequency-dependent compensating term to be introduced, allowing the compensating field to exactly match and subtract from the interfering field in the case where an IM introduces a time-dependent differential between the two quantities.

Before introduction as the supplementary additive term to summation node Σ2, it is necessary to modify the proportional PEM output voltage derived from the compensating means drive signal by the product of frequency domain transfer function $S_3$ and scalar ratiometric adjustment parameter γ, which is in essence a "fine tuning" adjustment that assumes practical importance in typical site installations.

As the principal modifying term, Laplace transform $S_3$ may assume the form of a frequency-independent spatial offset, a frequency-dependent compensating term, or a combination of the two. For example, in the special case where a) the sensor must be located away from the desired PV location of maximum interfering field attenuation, b) an appreciable interfering field gradient exists, and c) no frequency-dependent differential exists between the interfering and compensating fields through the PV, then the term becomes a frequency-independent constant proportional to the product of field gradient and distance between the sensor probe and PV location of maximum interfering field attenuation.

In the special case where the interfering field gradient is negligible but environmental alteration of the interfering and compensating fields exists due to environmental factors such as an IM or physically influential objects in or near the OV that interact differently with the interfering and compensating fields, proper selection of the $S_3$ order and coefficients prevent residual field within the PV from exhibiting significantly varying magnitude response to the range of frequency spectra that constitute the time-varying interfering field.

An active-compensation system of the prior art lacking this frequency-dependent compensation scheme could only adequately compensate two distinct spectra simultaneously present in the interfering field if the spectral transfer function of the compensating field were exactly that of the interfering field from sensor to PV. That is, in FIG. 2, compensation would occur if $S_1 = kS_2$, where k is an arbitrary constant corresponding to the field gradient and distance from probe to PV. However, if the physical environment near or between the sensor and PV includes an IM that physically interacts with the fields to produce a different frequency response with regard to the interfering and compensating constituents (e.g., a MRI magnet as previously discussed), then the terms $S_1$ and $S_2$ will vary differentially with frequency, conditions under which a conventional prior art ACS system is not capable of providing satisfactory cancellation.

In the ACR system, the frequency-dependent information is coded in Laplace transform term $S_3$ by the relationship defined in Equation 15, above, consequently modifying the compensation field response so that the interfering and compensating fields match in spectral content and thus temporally in the PV. Without this feature, good compensation can be obtained for one of the interfering field spectra but not simultaneously for both. In the general case where both an interfering field gradient and anisotropic IM may be present, the modifying term $S_3$ provides a linear combination of gradient offset and frequency-dependent information, addressing the two orthogonal dimensions of the problem.

Typical ACR magnetic ACS operating values for MRI service are:
Operational frequency range: 0.001 to 1,000 Hz
Open loop gain $(k_p S_4 T_A) \approx 35$ Closed-loop PV (isocenter) field attenuation at optimum calibration: >46 dB (factor of 200)

The fundamental ACR invention principle may also be implemented in the form of an anisotropically adaptive system that discriminates between or among extraneous field sources on the basis of directionality and gradient by means of a multiple sensor array for one or more orthogonal axes. The array would consist of at least two sensors for each implemented axis, thereby providing gradient information to the ACR system that, with appropriate processing, identifies the axial constituents of a vector describing the field source direction and gradient magnitude or, more generally, the composite vector describing a superposition of all axially-sampled field source directions and magnitudes. For an OV free of an Interacting Medium (IM), the constituent matrix elements of this vector are then employed as the basis of a computation that describes the drive signal required for each element of a single axial channel's compensating field sources. The net field produced by the compensating sources in each axis thus provides adaptive gradient compensation in the one or more active axes throughout the OV.

In the case where an IM of significant influence exists, the aforementioned information describing the vector field source direction and gradient magnitude is utilized as the basis of a computation that includes a model of the IM with a description of the IM anisotropic interactive properties. The intermediate result of the computation is a matrix of constituent Laplace transform terms describing superimposed IM properties from the perspective of all active source directions. This result may then be utilized in a further computation to determine the effective values of axial Laplace transform terms $S_3$ thereby providing unique frequency- and gradient-dependent compensation for fields from different source locations traversing an anisotropic IM within the OV.

A further refinement of the basic ACR invention is inclusion of compensation for the effects of cross-axial coupling that may occur with ACR systems consisting of more than one operative axis. Such compensation may be provided in the ACR system by introducing a matrix describing the corrective axial cross-coupling terms into the compensation signal computational process, as is well known in the art shown, for example, in the aforementioned reference of Buschbeck, et al. Because the unwanted cross-coupling effects are caused by fixed environmental factors, for example nearby ferromagnetic objects in the case of magnetic fields or nearby high dielectric constant objects in the case of electric fields, or geometric misalignment of compensating sources and sensors, these effects do not change significantly over time. Importantly, they also do not change significantly with the magnitude or direction of interfering or compensating fields. For these reasons, the cross-coupling correction terms for a specific site or non-orthogonal compensation source geometry may be programmed into the ACR on a long-term basis. Determination of proper axial cross-coupling correction coefficients for the ACR system is made prior to system installation by OV survey data collection and analysis, or after system installation by inclusion of a calibration algorithm that operates on the basis of providing known excitation signals to compensation source elements while sampling axial sensor responses, as described below.

Figure 3:
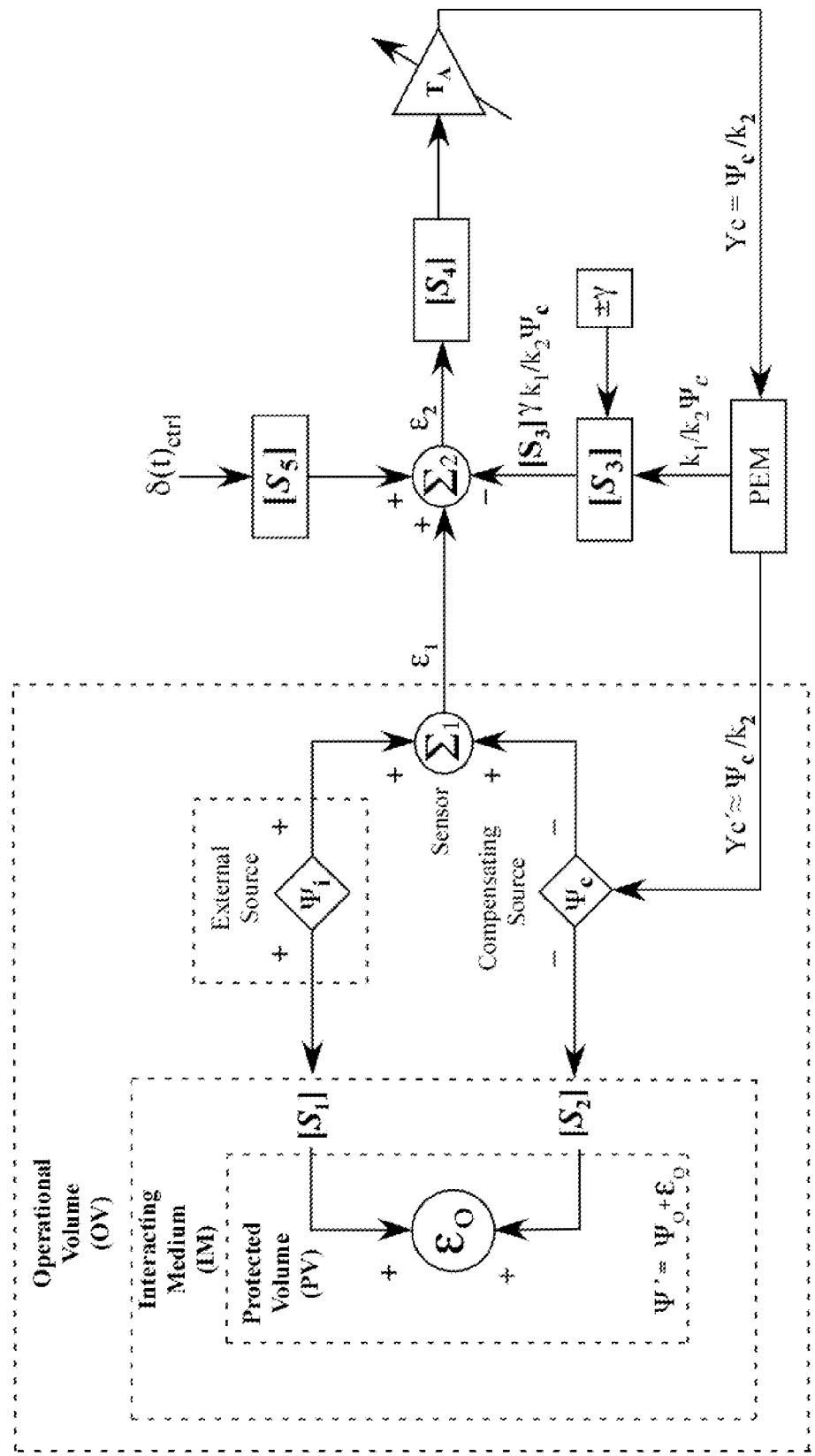
FIG. 3 is a schematic diagram of the ACR system configured for parametric control.

A second refinement to the ACR invention is the inclusion of a calibration algorithm providing known excitation signals to compensation source elements while sampling axial sensor responses, the algorithm then calculating the value of the Excitation Transfer Coefficient (ETC) for each axial channel. An "axial channel" is one discrete signal processing signal path through the ACR feedback invention as illustrated in FIGS. 2 and 3, for each of one or more operative axes as defined by the required invention configuration.

The term "Excitation Transfer Coefficient" (ETC) is specific to the present system. ETC is defined in that context as the ratio of the magnitude of the physical effect induced at or in the vicinity of the responsive sensor location to the magnitude of the compensating means input excitation. For magnetic fields, the ETC values have dimensions of Teslas per Ampere. Determination of ETC is important for system calibration, system-to-system comparative studies and improved estimation of materials requirements for installations. Axial magnetic field ETC measurements are performed by applying, sequentially, a calibrated coil excitation current to one set of axial coils at a time for determination of the corresponding ETC component. Post-installation ETC measurements provide a convenient and reliable method for identifying abnormal field situations due to installation errors or ferromagnetic materials in the site environment that can significantly affect system performance.

The resultant values may be examined to determine that the specified ACR compensating signal sources are adequate for the size of the OV to be either protected or subject to an ACR-controlled field, and the maximum value of the field to be compensated or generated. A variant of this capability permits utilizing the excitation of a given single axis while observing the ETC induced in one or more orthogonal axes to determine site-specific axial cross-coupling coefficients.

Control Configuration

Parametric control of superimposed fields within a PV, removed from and/or shielded from the sensing means location by an intervening IM, can be accomplished with an adaption of the ACR invention as illustrated in FIG. 3. Here, field control rather than field compensation is the desired capability.

To implement an external field control function requires two modifications of the FIG. 2 topology: a) the addition of a control port to summation node Σ2 with, optionally, frequency-dependent signal processing in the control signal path, and b) configuration of the compensation transfer function $S_3$ order and coefficients for control functionality. Operation of the ACR loops remains as previously described for the general active compensation functionality. However, the supplementary ratiometric compensation loop transfer function now provides correction for IM interaction with, and modification of the controlled (or compensating) field rather than correcting for the differential between an interfering field and a compensating field.

When term $S_3$ is correctly defined for the system environment, control signal δ(t) applied at the control port will effect a proportionate change in the controlled field within the PV, with optimal frequency and linear group phase response tailored by $S_3$ across the frequency range of the control passband, thus minimizing step function over- or undershoot, poor rise time, and other frequency-dependent control artifacts. The signal conditioning transfer function $S_5$, optionally applied to the control input signal, permits an arbitrary frequency response to be achieved within the PV, independent of the correction transfer function $S_3$.

A hypothetical example application of the ACR control configuration would be control of magnetic, electric or electromagnetic fields affecting a core fusion reaction within a strongly ionized quasi-shielding plasma sheath.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An Adjustable Compensation Ratio, closed-loop, negative-feedback system for compensation of physical fields in at least one axis within a Protected Volume of space located within a Volume of space, where such compensation is used for suppression of an undesired physical field, the system comprising:
   a) an axial subsystem comprising first physical field sensing means performing as a first summation node in a Volume of space, pre-amplification and bandshaping filters representable by a Laplace transform function, a secondary summation node, an adjustable post-amplifier, and an output power driver for providing a compensating physical field and corresponding constant attenuation coefficient per axis;
   b) parametric extraction means for generating a first ratiometric offset signal; and
   c) a supplementary direct loop operatively connected to said first summation node, said supplementary direct loop including said secondary summation node for receiving a first ratiometric offset signal to correct for environmental alteration of a compensating signal.

2. The Adjustable Compensation Ratio, closed-loop, negative-feedback system in accordance with claim 1, wherein said first ratiometric offset signal is frequency-dependent.

3. The Adjustable Compensation Ratio, closed-loop, negative-feedback system in accordance with claim 1, wherein said first physical field sensing means is located a predetermined distance from said Protected Volume of space.

4. The Adjustable Compensation Ratio, closed-loop, negative-feedback system in accordance with claim 1, further comprising an intermediary Interacting Medium (IM) surrounding said Protected Volume of space, wherein physical influence due to said Interacting Medium operating on traversing fields is characterized by first and second Laplace transform expressions.

5. The Adjustable Compensation Ratio, closed-loop, negative-feedback system in accordance with claim 4, further comprising a third Laplace transform expression, wherein said third Laplace transform is a function of said first and said second Laplace transform expressions.

6. The Adjustable Compensation Ratio, closed-loop, negative-feedback system in accordance with claim 5, wherein said secondary summation node sums a signal over time represented by said third Laplace transform expression for generating a compensating signal.

7. The Adjustable Compensation Ratio, closed-loop, negative-feedback system in accordance with claim 1, said system compensating at least one set of fields chosen from the group: magnetic fields; electric fields; electromagnetic fields; and acoustic fields.

8. The Adjustable Compensation Ratio, closed-loop, negative-feedback system in accordance with claim 1, further comprising multiple physical field sensing means per axis for adaptive physical field compensation of multiple physical field interference sources.

9. The Adjustable Compensation Ratio, closed-loop, negative-feedback system in accordance with claim 1, further comprising means for introducing cross-coupling compensation terms from orthogonal axial channels.

10. The Adjustable Compensation Ratio, closed-loop, negative-feedback system in accordance with claim 1, further comprising means for directly measuring an Excitation Transfer Coefficient for each axial channel.

11. An Adjustable Compensation Ratio, closed-loop, negative-feedback system for control of physical fields in at least one axis within a Protected Volume of space located within a Volume of space, said control establishing a physical field of predetermined parametric value, the system comprising:
   a) an axial subsystem comprising first physical field sensing means performing as a first summation node in said Volume of space, pre-amplification and bandshaping filters representable by a Laplace transform function, a secondary summation node, an adjustable post-amplifier, and an output power driver for providing a compensating physical field and corresponding constant attenuation coefficient per axis;
   b) parametric extraction means for generating a first ratiometric offset signal;
   c) a supplementary direct loop operatively connected to said first summation node, said supplementary direct loop including said secondary summation node for receiving a first ratiometric offset signal to correct for environmental alteration of a compensating signal; and
   d) an external input signal channel operatively connected to said secondary node for receiving a parametric control signal for establishing a parametrically-defined physical field within the said Protected Volume of space.

12. The Adjustable Compensation Ratio, closed-loop, negative-feedback system in accordance with claim 11, wherein said external input signal channel comprises at least one bandshaping filter representable by Laplace transform functions.

13. The Adjustable Compensation Ratio, closed-loop, negative-feedback system in accordance with claim 11, wherein said first ratiometric offset signal is frequency-dependent.

14. The Adjustable Compensation Ratio, closed-loop, negative-feedback system in accordance with claim 13, wherein said first physical field sensing means is located a predetermined distance from said Protected Volume of space.

15. The physical field Adjustable Compensation Ratio, closed-loop, negative-feedback system in accordance with claim 14, further comprising an intermediary Interacting Medium surrounding said Protected Volume of space, wherein physical influence due to said Interacting Medium operating on traversing fields is characterized by first and second Laplace transform expressions.

16. The Adjustable Compensation Ratio, closed-loop, negative-feedback system in accordance with claim 15, further comprising a third Laplace transform expression, said third Laplace transform expression being a function of said first and said second Laplace transform expressions.

17. The Adjustable Compensation Ratio, closed-loop, negative-feedback system in accordance with claim 16, wherein said secondary summation node sums a signal over time represented by said third Laplace transform expression for generating a compensating signal.

18. The Adjustable Compensation Ratio, closed-loop, negative-feedback system in accordance with claim 11, said system creating at least one set of fields chosen from the group: magnetic fields; electric fields; electromagnetic fields; and acoustic fields.

19. The Adjustable Compensation Ratio, closed-loop, negative-feedback system in accordance with claim 11, further comprising means for introducing cross-coupling compensation terms from orthogonal axial channels.

20. The Adjustable Compensation Ratio, closed-loop, negative-feedback system in accordance with claim 11, further comprising means for directly measuring an Excitation Transfer Coefficient for each axial channel.

21. An Adjustable Compensation Ratio, closed-loop, negative-feedback system for combined compensation and control of physical fields in at least one axis within a Protected Volume of space located within a Volume of space, wherein such compensation and control simultaneously suppress an undesired physical field and establish a physical field of predetermined parametric value, the system comprising:
   a) an axial subsystem comprising first physical field sensing means performing as a first summation node in said Volume of space, pre-amplification and bandshaping filters representable by a Laplace transform function, a secondary summation node, an adjustable post-amplifier, and an output power driver for providing a compensating physical field and corresponding constant attenuation coefficient per axis;
   b) parametric extraction means for generating a first ratiometric offset signal;
   c) a supplementary direct loop operatively connected to said first summation node, said supplementary direct loop including said secondary summation node for receiving a first ratiometric offset signal to correct for environmental alteration of a compensating signal; and
   d) an external input signal channel operatively connected to said secondary node for receiving a parametric control signal for establishing a defined physical field within said Protected Volume of space.

22. The Adjustable Compensation Ratio, closed-loop, negative-feedback system in accordance with claim 21, wherein said external input signal channel includes at least one bandshaping filter representable by Laplace transform functions.

23. The Adjustable Compensation Ratio, closed-loop, negative-feedback system in accordance with claim 22, wherein said first ratiometric offset signal is frequency-dependent.

24. The Adjustable Compensation Ratio, closed-loop, negative-feedback system in accordance with claim 22, wherein said first physical field sensing means is located a predetermined distance from said Protected Volume of space.

25. The Adjustable Compensation Ratio, closed-loop, negative-feedback system in accordance with claim 22, further comprising an intermediary Interacting Medium surrounding said Protected Volume of space, wherein the physical influence due to said Interacting Medium operating on traversing fields is characterized by first and second Laplace transform expressions.

26. The Adjustable Compensation Ratio, closed-loop, negative-feedback system in accordance with claim 25, further comprising a third Laplace transform expression being a function of said first and second Laplace transform expressions.

27. The Adjustable Compensation Ratio, closed-loop, negative-feedback system in accordance with claim 26, wherein secondary summation node sums a signal over time represented by said third Laplace transform expression for generating a compensating signal.

28. The Adjustable Compensation Ratio, closed-loop, negative-feedback system in accordance with claim 22, said system simultaneously compensating and controlling at least one set of fields chosen from the group: magnetic fields; electric fields; electromagnetic fields; and acoustic fields.

29. The Adjustable Compensation Ratio, closed-loop, negative-feedback system in accordance with claim 22, further comprising multiple sensing means per axis for adaptive physical field compensation of multiple physical field interference sources.

30. The Adjustable Compensation Ratio, closed-loop, negative-feedback system in accordance with claim 22, further comprising means for introducing cross-coupling compensation terms from orthogonal axial channels.

31. The Adjustable Compensation Ratio, closed-loop, negative-feedback system in accordance with claim 22, further comprising means for directly measuring an Excitation Transfer Coefficient for each axial channel.

\* \* \* \* \*

UNITED STATES PATENT AND TRADEMARK OFFICE
CERTIFICATE OF CORRECTION

| | | |
|---|---|---|
| PATENT NO. | : 9,692,391 B2 | Page 1 of 1 |
| APPLICATION NO. | : 13/959787 | |
| DATED | : June 27, 2017 | |
| INVENTOR(S) | : Curt R. Dunnam | |

It is certified that error appears in the above-identified patent and that said Letters Patent is hereby corrected as shown below:

On the Title Page

Item [71], insert:
--Linear Research Associates, Inc., Trumansburg, NY (US)--

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*